(12) United States Patent
Phillips

(10) Patent No.: US 11,675,279 B2
(45) Date of Patent: Jun. 13, 2023

(54) APPARATUS FOR REMOVING PHOTORESIST OFF OF PHOTOMASK

(71) Applicant: Applied Materials, Inc., Santa Clara, CA (US)

(72) Inventor: Tyler Joe Phillips, Boise, ID (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/393,933

(22) Filed: Aug. 4, 2021

(65) Prior Publication Data

US 2022/0043361 A1 Feb. 10, 2022

(51) Int. Cl.
*G03F 7/20* (2006.01)
*G03F 7/00* (2006.01)

(52) U.S. Cl.
CPC ................. *G03F 7/70916* (2013.01)

(58) Field of Classification Search
CPC ...... G03F 7/70916; G03F 7/162; G03F 7/168; G03F 1/82; G03F 7/42; H01L 21/6708; H01L 21/6715; H01L 21/02096; H01L 21/02057; H01L 21/67028
See application file for complete search history.

(56) References Cited

U.S. PATENT DOCUMENTS

| | | | |
|---|---|---|---|
| 6,238,511 B1 * | 5/2001 | Sada | ..................... B05D 3/007 216/92 |
| 7,691,559 B2 | 4/2010 | Chang et al. | |
| 8,550,031 B2 | 10/2013 | Ishikawa et al. | |
| 2005/0008943 A1 | 1/2005 | Rolfson | |

\* cited by examiner

*Primary Examiner* — Mesfin T Asfaw
(74) *Attorney, Agent, or Firm* — Moser Taboada

(57) ABSTRACT

Embodiments of a photomask removal apparatus for removing photoresist off of a photomask are provided herein. In some embodiments, a nozzle head for removing photoresist off of a photomask includes: a nozzle portion having a first side and an opposing second side and a flow path extending from the first side to the second side, wherein the flow path includes an orifice disposed between the first side and the second side and a nozzle that extends from the orifice to a nozzle exit on the second side, and wherein the flow path in the nozzle increases in width at an angle from the orifice to the second side; and a vacuum portion coupled to the nozzle portion, wherein the vacuum portion includes a first side and an opposing second side that faces the nozzle exit, wherein the vacuum portion includes a vacuum port extending from the second side.

20 Claims, 3 Drawing Sheets

US 11,675,279 B2

APPARATUS FOR REMOVING PHOTORESIST OFF OF PHOTOMASK

CROSS-REFERENCE TO RELATED APPLICATIONS

This application claims priority to International Patent Application No. PCT/US2020/044846, filed Aug. 4, 2020, and entitled "APPARATUS FOR REMOVING PHOTORESIST OFF OF PHOTOMASK," the contents of which are hereby incorporated by reference in its entirety.

FIELD

Embodiments of the present disclosure generally relate to substrate processing equipment.

BACKGROUND

Photomasks are plates having holes or transparencies that allow light to shine through in a defined pattern. Photomasks are commonly used in photolithography for transferring the defined pattern onto a semiconductor wafer in the production of integrated circuits. Photomasks are typically made by applying a photoresist to a substrate. The substrate commonly is made of quartz that is plated with a thin coating of a nontransparent material, such as chrome that prevent light from passing through selected portion of the photomask. Photoresist may be applied to the substrate via a spin coating process. However, the spin coating process often results in the formation of a photoresist edge bead on the photomask, which leads to defects in subsequent semiconductor wafer processing.

Accordingly, the inventors have provided embodiments of improved apparatus for removing photoresist from selective portions of photomasks.

SUMMARY

Embodiments of a photomask removal apparatus for removing photoresist off of a photomask are provided herein. In some embodiments, a nozzle head for removing photoresist off of a photomask includes: a nozzle portion having a first side and an opposing second side and a flow path extending from the first side to the second side, wherein the flow path includes an orifice disposed between the first side and the second side and a nozzle that extends from the orifice to a nozzle exit on the second side, and wherein the flow path in the nozzle increases in width at an angle from the orifice to the second side; and a vacuum portion coupled to the nozzle portion, wherein the vacuum portion includes a first side and an opposing second side that faces the nozzle exit, wherein the vacuum portion includes a vacuum port extending from the second side.

In some embodiments, a photomask removal apparatus includes: a first nozzle head having a first flow path extending therethrough, wherein the first flow path includes a nozzle that increases in width at an angle from an orifice disposed within the first nozzle head to an exterior surface of the first nozzle head, and wherein the first nozzle head includes a vacuum port extending therethrough; a second nozzle head having a second flow path extending therethrough and a second vacuum port extending therethrough; and an arm coupled to the first nozzle head and the second nozzle head, wherein the arm is configured to move the first nozzle head and the second nozzle head in unison.

In some embodiments, a process chamber for removing photoresist off of a photomask includes: a chamber body having an interior volume therein; a support for holding a photomask disposed in the interior volume; a first nozzle head disposed on a side of the support including a nozzle portion coupled to a vacuum portion, wherein the nozzle portion includes a first side, an opposing second side, and a flow path extending from the first side to the second side, wherein the flow path includes an orifice disposed between the first side and the second side and a nozzle that extends from the orifice to a nozzle exit on the second side, wherein the flow path in the nozzle increases in width at an angle from the orifice to the second side, and wherein the vacuum portion includes a vacuum port extending from a side of the vacuum portion facing the nozzle exit; a solvent supply fluidly coupled to the flow path of the first nozzle head to remove photoresist from a side of the photomask; a vacuum pump coupled to the vacuum port of the first nozzle head; and an arm coupled to the first nozzle head, wherein the arm is configured to move the first nozzle head across a side of the support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
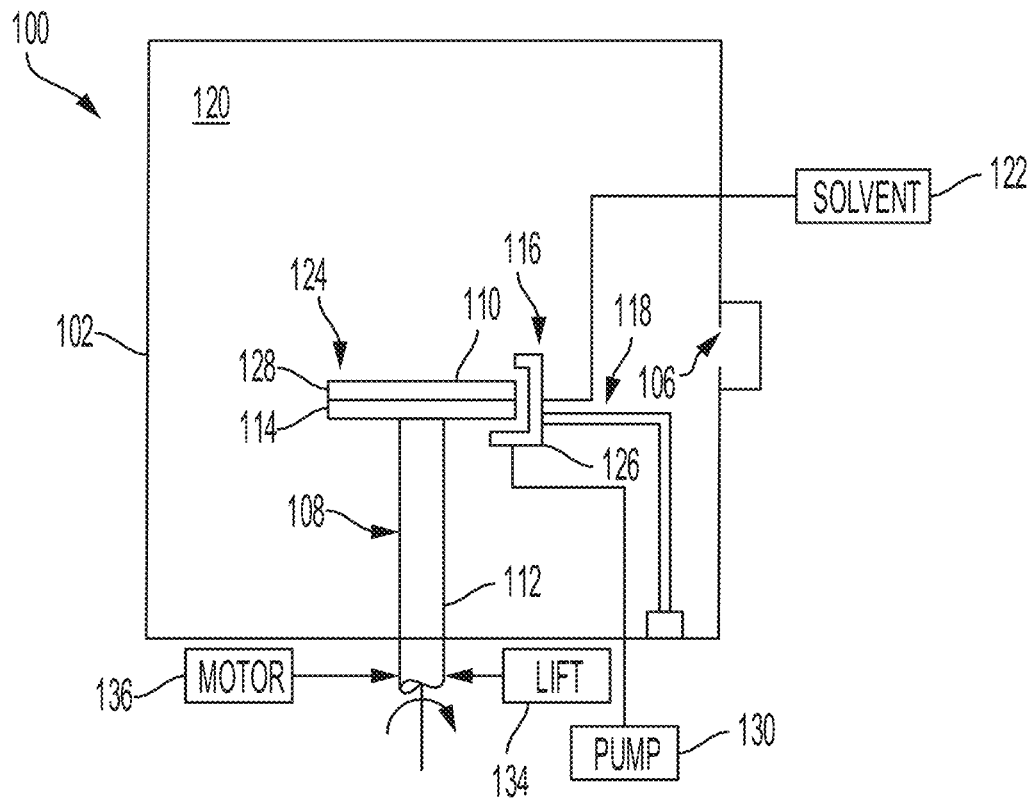
FIG. 1A depicts a schematic side view of a process chamber in accordance with some embodiments of the present disclosure.
Figure 1B:
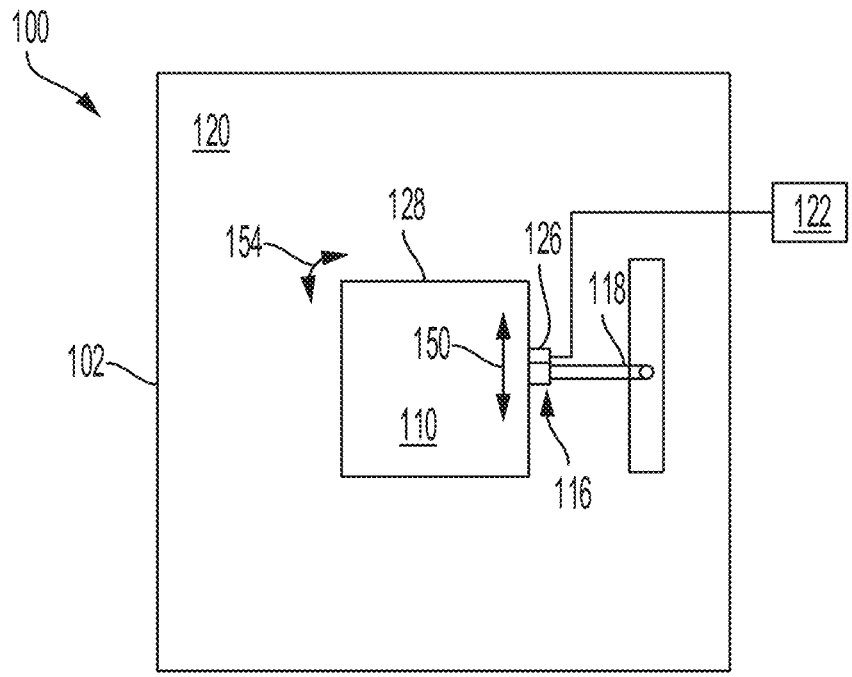
FIG. 1B depicts a schematic top view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of photomask removal apparatus are provided herein. During a photoresist application process onto a photomask via spin coating, unwanted edge beads may form at upper edges of the photomask and unwanted photoresist may be applied to sides of the photomask. The photomask removal apparatus described herein include one or more nozzle heads having flow paths configured to flow a solvent therethrough to remove photoresist from selective portions of a photomask. In some embodiments, the selective portions are a peripheral top edge of the photomask. In some embodiments, the selective portions are the sidewalls of the photomask. The flow path of at least one of the one or more nozzle heads include a nozzle having an angled flow path to advantageously reduce or prevent air pockets in the flow path to provide a more uniform stream of solvent and to reduce unwanted splashing of the solvent. The solvent may be any suitable commercially available photoresist removal solvents, for example, a solvent containing propanol acetate.

FIGS. 1A and 18 depict a schematic side view and top view, respectively, of a process chamber in accordance with some embodiments of the present disclosure. The process chamber 100 includes a chamber body 102 having an interior volume 120 therein. In some embodiments, the process chamber 100 is a standalone chamber. In some embodiments, the process chamber 100 is part of a multi-chamber processing apparatus. For example, the process chamber 100 may be a part of the SIGMAMEL TEC® line of tools commercially available from Applied Materials of Santa Clara, Calif.

The process chamber 100 includes a support 108 disposed in the interior volume 120. The support 108 generally includes a support shaft 112 and pedestal 114 coupled to the support shaft 112. The pedestal 114 includes an upper surface for holding or supporting a photomask 110 in the interior volume 120. The photomask 110 includes a layer of photoresist. The photomask 110 may be transferred into and out of the interior volume 120 via a transfer opening 106 in the chamber body 102. In some embodiments, the photomask 110 has a rectangular or square shape.

A photomask removal apparatus 116 is disposed on a side of the pedestal 114. The photomask removal apparatus 116 is fluidly coupled to a solvent supply 122 configured to supply one or more solvents. The photomask removal apparatus 116 includes one or more nozzle heads 126 configured to direct solvent from the solvent supply 122 to the photomask 110 to remove photoresist from selective portions of the photomask 110. In some embodiments, each of the one or more nozzle heads 126 is fluidly coupled to a same solvent of the solvent supply 122. In some embodiments, each of the one or more nozzle heads 126 is fluidly coupled to different solvents of the solvent supply 122 (see solvent supply 122A and solvent supply 122B below).

In some embodiments, each of the one or more nozzle heads 126 is coupled to a vacuum pump 130 to remove solvent and removed photoresist from the interior volume 120. In some embodiments, the vacuum pump 130 is a single pump coupled to each of the one or more nozzle heads 126. In some embodiments, the vacuum pump 130 comprises a separate pump coupled to each of the one or more nozzle heads 126.

In some embodiments, the photomask removal apparatus 116 includes an arm 118 coupled to the one or more nozzle heads 126 to move the one or more nozzle heads 126 across sidewalls 128 of the photomask 110 and thereby across a side of the support in a linear direction 150. In some embodiments, the arm 118 is configured to move the one or more nozzle heads 126 in unison. In some embodiments, the arm 118 is configured to move the one or more nozzle heads 126 separately.

The support 108 may be coupled to a lift mechanism 134 to selectively raise or lower the support 108 in the interior volume 120. The support 108 may be coupled to a motor 136 to rotate the support 108 in a rotational direction 154. In use, the pedestal 114 may be placed in a transfer position within the interior volume 120. The photomask 110 is placed on the pedestal 114 when in the transfer position. The pedestal 114 is then selectively lowered or raised to a processing position (as shown in FIG. 1A). Solvent is flowed through the photomask removal apparatus 116 and directed at the photomask 110 while the arm 118 moves, or scans, the one or more nozzle heads 126 across a first of the sidewalls 128. The support 108 is then selectively raised or lowered, then rotated so that the photomask removal apparatus 116 is positioned along a second of the sidewalls 128, then selectively raised or lowered back to the processing position. Solvent is flowed through the photomask removal apparatus 116 and directed at the photomask 110 while the arm 118 moves the one or more nozzle heads 126 across the second of the sidewalls 128. This may be repeated until the photomask removal apparatus 116 has been positioned along each of the sidewalls 128.

Figure 2A:
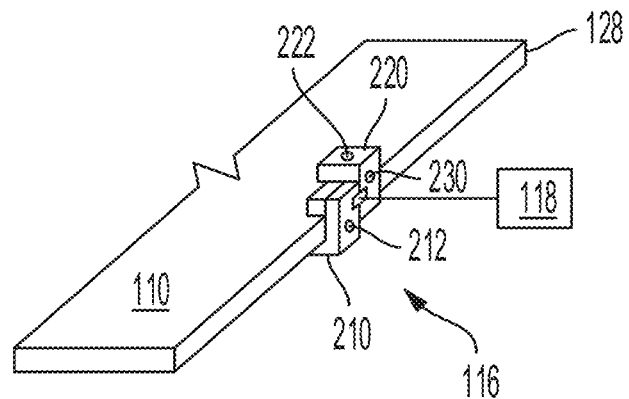
FIG. 2A depicts a schematic isometric view a photomask removal apparatus in accordance with some embodiments of the present disclosure.

FIG. 2A depicts a schematic isometric view of a photomask removal apparatus 116 in accordance with some embodiments of the present disclosure. In some embodiments, the one or more nozzle heads 126 include a first nozzle head 210 and a second nozzle head 220. The first nozzle head 210 includes a first flow path 212 extending therethrough. The second nozzle head 220 includes a second flow path 222 extending therethrough. In some embodiments, the second flow path 222 is disposed perpendicular to the first flow path 212. In some embodiments, the first flow path 212 is horizontally oriented and the second flow path 222 is vertically oriented.

The first nozzle head 210 is coupled to the arm 118 configured to move the first nozzle head 210 across sidewalls 128 of the photomask 110. In some embodiments, the second nozzle head 220 is coupled to the arm 118 and moves with the first nozzle head 210. In some embodiments, the first nozzle head 210 is disposed adjacent and abutting the second nozzle head 220. In some embodiments, the first nozzle head 210 is spaced from the second nozzle head 220.

Figure 2B:
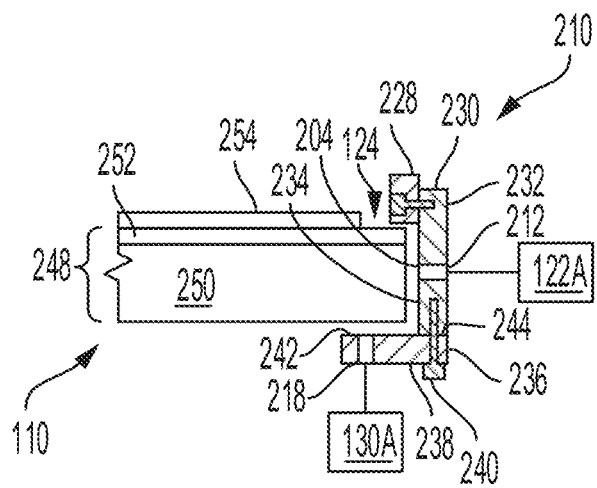
FIG. 2B depicts a schematic side view of a first nozzle head in accordance with some embodiments of the present disclosure.

FIG. 2B depicts a schematic side view of the first nozzle head 210 in accordance with some embodiments of the present disclosure. In some embodiments, the first nozzle head 210 includes a nozzle portion 230 having a first side 232 and an opposing second side 234 that faces the photomask 110. In some embodiments, the first flow path 212 extends from the first side 232 to a nozzle exit 204 on the second side 234. The first flow path 212 is fluidly coupled to solvent supply 122A. In some embodiments, a shield 228 is coupled to the nozzle portion 230 to reduce or prevent splashing of the solvent from the solvent supply 122A onto an upper surface of the photomask 110.

In some embodiments, a vacuum portion 236 is coupled to the nozzle portion 230. In some embodiments, the vacuum portion 236 includes a first side 238 and an opposing second side 242 that faces the second side 234 of the nozzle portion 230. The vacuum portion 236 includes a vacuum port 218 extending from the second side 242. In some embodiments, the vacuum port 218 extends from the second side 242 to the first side 238. The vacuum port 218 is fluidly coupled to vacuum pump 130A.

In some embodiments, the first flow path 212 extends perpendicular to the vacuum port 218. In some embodiments, the nozzle portion 230 and the vacuum portion 236 form an L-shaped cross-section. In some embodiments, the vacuum portion 236 is coupled to the nozzle portion 230 via fasteners 240. In some embodiments, the fasteners 240 extend through the vacuum portion 236 and partially into the nozzle portion 230 from a lower surface 244 of the nozzle portion 230. In some embodiments, the nozzle portion 230 is vertically oriented. In some embodiments, the vacuum portion 236 is horizontally oriented.

In some embodiments, the photomask 110 includes a substrate 248 comprising a first layer 250 and a second layer 252 disposed on the first layer 250. In some embodiments, the first layer 250 is made of a transparent material, for example, quartz. In some embodiments, the second layer 252 is made of a nontransparent material, for example, chrome. The photomask 110 includes a photoresist layer 254 disposed on the substrate 248.

Figure 2C:
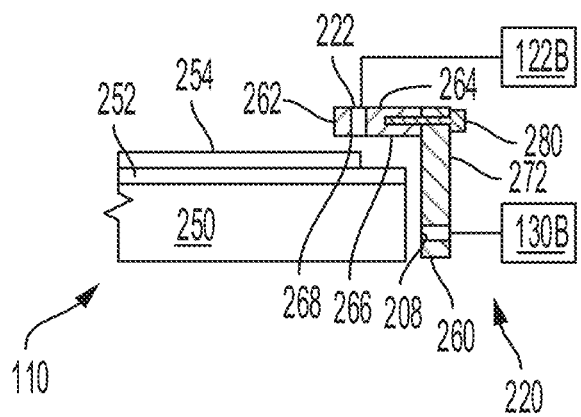
FIG. 2C depicts a schematic side view of a second nozzle head in accordance with some embodiments of the present disclosure.

FIG. 2C depicts a schematic side view of the second nozzle head 220 in accordance with some embodiments of the present disclosure. In some embodiments, the second nozzle head 220 includes a second nozzle portion 262 having the second flow path 222 extending therethrough to a second nozzle exit 268. In some embodiments, the second nozzle head 220 includes a second vacuum portion 260 having a second vacuum port 208 extending from a side of the second vacuum portion 260 facing the second nozzle exit 268. In some embodiments, the second vacuum port 208 extends from a side of the second vacuum portion 260 facing the second nozzle exit 268 to a second side 272 of the second vacuum portion 260. In some embodiments, the second nozzle portion 262 may be coupled to the second vacuum portion 260 via fasteners 280. In some embodiments, the second nozzle portion 262 is horizontally oriented. In some embodiments, the second vacuum portion 260 is vertically oriented.

In some embodiments, a solvent supply 122B is fluidly coupled to the second flow path 222 to remove photoresist from the photoresist layer 254 proximate the peripheral edge 124 of the photomask 110. In some embodiments, the second vacuum port 208 is coupled to vacuum pump 130B. In some embodiments, vacuum pump 130B is the same as vacuum pump 130A. In some embodiments, vacuum pump 130B is disposed separate from vacuum pump 130A.

Figure 3:
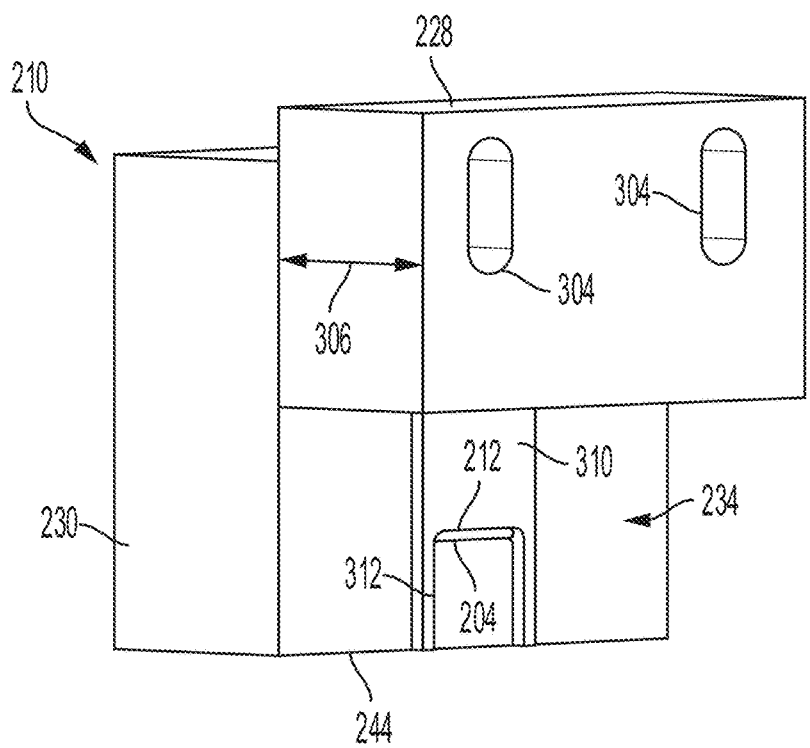
FIG. 3 depicts an isometric view of a portion of the first nozzle head in accordance with some embodiments of the present disclosure.

FIG. 3 depicts an isometric view of a portion of the first nozzle head 210 in accordance with some embodiments of the present disclosure. In some embodiments, the shield 228 is coupled to an exterior surface of the first nozzle head 210 above the first flow path 212 to shield an upper surface of the photomask 110 from unwanted splashing of the solvent. For example, the shield 228 is coupled to the second side 234 of the nozzle portion 230. In some embodiments, the shield 228 includes slotted screw holes 304 to adjustably mount the shield 228 to the first nozzle head 210. In some embodiments, the shield has a width 306 of about 5.0 mm to about 10.0 mm. In some embodiments, the second side 234 of the nozzle portion 230 includes a raised portion 310 to further guide a flow of the solvent from the nozzle exit 204 away from an upper surface of the photomask 110. In some embodiments, the raised portion 310 is disposed at least partially about the nozzle exit 204. In some embodiments, the raised portion 310 includes a cutout 312 extending from the nozzle exit 204 to the lower surface 244 of the nozzle portion 230.

Figure 4:
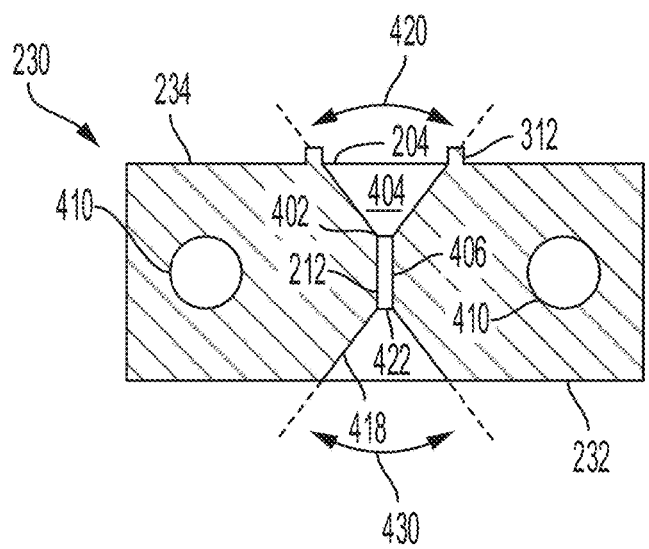
FIG. 4 depicts a cross-sectional top view of a portion of the first nozzle head in accordance with some embodiments of the present disclosure.

FIG. 4 depicts a cross-sectional top view of a portion of the first nozzle head 210 in accordance with some embodiments of the present disclosure. In some embodiments, the nozzle portion 230 includes openings 410 to accommodate fasteners 240 for coupling the nozzle portion 230 to the vacuum portion 236. In some embodiments, the first flow path 212 includes an orifice 402 disposed between the first side 232 and the second side 234. In some embodiments, a nozzle 404 extends from the orifice 402 to the nozzle exit 204 on the second side 234.

The first flow path 212 in the nozzle 404 increases in width at an angle 420 from the orifice 402 to the second side 234. In some embodiments, the angle 420 is constant. In some embodiments, the angle 420 is about 70 degrees to about 85 degrees. In some embodiments, the first flow path 212 includes a channel 406 extending from the orifice 402 towards the first side 232 of the nozzle portion 230. In some embodiments, the channel 406 has a circular cross-section. In some embodiments, the channel 406 includes a second orifice 422 on a side of the channel 406 opposite the orifice 402. In some embodiments, the first flow path 212 includes a conical portion 418 extending from the second orifice 422 to the first side 232 of the nozzle portion 230. In some embodiments, the conical portion 418 extends at an angle 430 of about 30 degrees to about 80 degrees.

Figure 5:
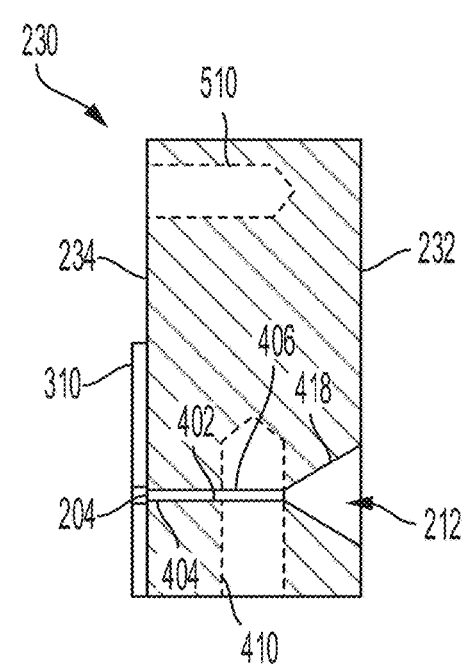
FIG. 5 depicts a cross-sectional side view of a portion of the first nozzle head in accordance with some embodiments of the present disclosure.

FIG. 5 depicts a cross-sectional side view of a portion of the first nozzle head 210 in accordance with some embodiments of the present disclosure. In some embodiments, the nozzle 404 has a substantially constant height from the orifice 402 to the nozzle exit 204. In some embodiments, the nozzle portion 230 includes openings 510 to facilitate coupling the shield 228 to the nozzle portion 230.

While the foregoing is directed to embodiments of the present disclosure, other and further embodiments of the disclosure may be devised without departing from the basic scope thereof.

The invention claimed is:

1. A nozzle head for removing photoresist off of a photomask, comprising:
a nozzle portion having a first side and an opposing second side and a flow path extending from the first side to the second side, wherein the flow path includes an orifice disposed between the first side and the second side and a nozzle that extends from the orifice to a nozzle exit on the second side, and wherein the flow path in the nozzle increases in width at an angle from the orifice to the second side; and
a vacuum portion coupled to the nozzle portion, wherein the vacuum portion includes a first side and an opposing second side that faces the nozzle exit, wherein the vacuum portion includes a vacuum port extending from the second side.

2. The nozzle head of claim 1, wherein the angle is about 70 degrees to about 85 degrees.

3. The nozzle head of claim 1, wherein the flow path includes a channel having a circular cross-section extending from the orifice towards the first side of the nozzle portion, wherein the channel includes a second orifice on a side of the channel opposite the orifice.

4. The nozzle head of claim 3, wherein the flow path includes a conical portion extending from the second orifice to the first side of the nozzle portion.

5. The nozzle head of claim 1, wherein the vacuum portion is coupled to the nozzle portion via fasteners that extend through the vacuum portion and partially into the nozzle portion from a lower surface of the nozzle portion.

6. The nozzle head of claim 1, further comprising a shield disposed outside of the nozzle portion and coupled to the second side of the nozzle portion.

7. The nozzle head of claim 6, wherein the shield has a width of about 5.0 mm to about 10.0 mm.

8. The nozzle head of claim 6, wherein the shield includes slotted screw holes to adjustably mount the shield to the nozzle portion.

9. The nozzle head of claim 1, wherein the nozzle portion and the vacuum portion form an L-shaped cross-section.

10. A photomask photoresist removal apparatus, comprising:
- a first nozzle head having a first flow path extending therethrough, wherein the first flow path includes a nozzle that increases in width at an angle from an orifice disposed within the first nozzle head to an exterior surface of the first nozzle head, and wherein the first nozzle head includes a vacuum port extending therethrough;
- a second nozzle head having a second flow path extending therethrough and a second vacuum port extending therethrough; and
- an arm coupled to the first nozzle head and the second nozzle head, wherein the arm is configured to move the first nozzle head and the second nozzle head in unison.

11. The photomask photoresist removal apparatus of claim 10, wherein the first nozzle head is disposed adjacent to and abuts the second nozzle head.

12. The photomask photoresist removal apparatus of claim 10, wherein at least one of:
the second flow path is disposed perpendicular to the first flow path, or the first flow path extends perpendicular to the vacuum port.

13. The photomask photoresist removal apparatus of claim 12, wherein the first flow path is horizontally oriented and the second flow path is vertically oriented.

14. The photomask photoresist removal apparatus of claim 10, further comprising a shield coupled to the exterior surface of the first nozzle head, wherein the shield includes slotted screw holes to adjustably mount the shield to first nozzle head.

15. A process chamber for removing photoresist off of a photomask, comprising:
- a chamber body having an interior volume therein;
- a support for holding a photomask disposed in the interior volume;
- a first nozzle head disposed on a side of the support including a nozzle portion coupled to a vacuum portion, wherein the nozzle portion includes a first side, an opposing second side, and a flow path extending from the first side to the second side, wherein the flow path includes an orifice disposed between the first side and the second side and a nozzle that extends from the orifice to a nozzle exit on the second side, wherein the flow path in the nozzle increases in width at a substantially constant angle from the orifice to the second side, and wherein the vacuum portion includes a vacuum port extending from a side of the vacuum portion facing the nozzle exit;
- a solvent supply fluidly coupled to the flow path of the first nozzle head to remove photoresist from a side of the photomask;
- a vacuum pump coupled to the vacuum port of the first nozzle head; and
- an arm coupled to the first nozzle head, wherein the arm is configured to move the first nozzle head across a side of the support.

16. The process chamber of claim 15, further comprising:
- a second nozzle head including a second nozzle portion having a second flow path extending therethrough to a second nozzle exit and a second vacuum portion having a second vacuum port extending from a side of the second vacuum portion facing the second nozzle exit;
- a second solvent supply fluidly coupled to the second flow path to remove photoresist from a peripheral edge of the photomask; and
- a second vacuum pump coupled to the second vacuum port.

17. The process chamber of claim 16, wherein the second nozzle head is coupled to the arm and moves with the first nozzle head.

18. The process chamber of claim 15, wherein the support is coupled to a lift mechanism for selectively raising or lowering the support.

19. The process chamber of claim 15, wherein the support is coupled to a motor to rotate the support.

20. The process chamber of claim 15, wherein the angle is about 70 degrees to about 85 degrees.

* * * * *